(12) United States Patent
Narita

(10) Patent No.: US 11,271,387 B2
(45) Date of Patent: Mar. 8, 2022

(54) STORAGE SYSTEM AND PROTECTION METHOD

(71) Applicant: Kioxia Corporation, Minato-ku (JP)

(72) Inventor: Teruyuki Narita, Machida (JP)

(73) Assignee: Kioxia Corporation, Minato-ku (JP)

( * ) Notice: Subject to any disclaimer, the term of this patent is extended or adjusted under 35 U.S.C. 154(b) by 8 days.

(21) Appl. No.: 16/820,789

(22) Filed: Mar. 17, 2020

(65) Prior Publication Data

US 2021/0091555 A1 Mar. 25, 2021

(30) Foreign Application Priority Data

Sep. 20, 2019 (JP) .............................. JP2019-172342

(51) Int. Cl.
*H02H 7/20* (2006.01)
*H02H 1/00* (2006.01)
*G11C 16/30* (2006.01)
*H02J 9/06* (2006.01)
*G11C 16/04* (2006.01)
*G06F 1/30* (2006.01)

(52) U.S. Cl.
CPC .............. *H02H 7/20* (2013.01); *G11C 16/30* (2013.01); *H02H 1/0007* (2013.01); *H02J 9/06* (2013.01); *G06F 1/30* (2013.01); *G11C 16/0483* (2013.01)

(58) Field of Classification Search
CPC ........ H02H 7/20; H02H 1/0007; G11C 16/30; G11C 16/0483; H02J 9/06; G01R 31/00
USPC ........................................................ 361/93.1
See application file for complete search history.

(56) References Cited

U.S. PATENT DOCUMENTS

| | | | |
|---|---|---|---|
| 9,143,005 B1* | 9/2015 | Laird | G11C 5/141 |
| 2005/0253458 A1* | 11/2005 | Omae | H01M 16/00 |
| | | | 307/10.1 |
| 2007/0213164 A1 | 9/2007 | Tasaka et al. | |
| 2010/0332896 A1* | 12/2010 | Wilson | G06F 1/30 |
| | | | 714/14 |
| 2018/0059761 A1 | 3/2018 | An et al. | |

FOREIGN PATENT DOCUMENTS

| | | | | |
|---|---|---|---|---|
| JP | 2007-038735 A | 2/2007 | | |
| JP | 2007-198234 A | 8/2007 | | |
| JP | 2009288221 A | * 12/2009 | ............ | G01R 31/00 |
| JP | 2010-122857 A | 6/2010 | | |

* cited by examiner

*Primary Examiner* — Yemane Mehari
(74) *Attorney, Agent, or Firm* — Oblon, McClelland, Maier & Neustadt, L.L.P.

(57) ABSTRACT

A storage system includes a power supply circuit, a backup circuit and a switch circuit. The power supply circuit supplies power to a semiconductor storage element. The backup circuit has a condenser capable of being charged by using the power from the power supply circuit and supplies the power charged on the condenser to the semiconductor storage element when a voltage of the power supply circuit declines to be equal to or smaller than a threshold value set in advance. The switch circuit monitors a value of a leakage current of the condenser and performs an operation related to deterioration of the condenser when the value of the leakage current fulfills a deterioration condition set in advance.

6 Claims, 3 Drawing Sheets

ALARM SIGNAL

STORAGE SYSTEM AND PROTECTION METHOD

CROSS REFERENCE TO RELATED APPLICATIONS

This application is based upon and claims the benefit of priority from the prior Japanese Patent Application No. 2019-172342, filed on Sep. 20, 2019; the entire contents of which are incorporated herein by reference.

FIELD

Embodiments of the present invention relate to a storage system having a semiconductor storage element such as an SSD (Solid State Drive), an eMMC (embedded Multi Media Card) and a UFS (Universal Flash Storage), and to a protection method.

BACKGROUND

Conventionally, in a storage system for example, a plurality of condensers for PLP (Power Loss Protection) are connected in parallel to a power supply circuit supplying power to a memory in order to cope with instantaneous power supply interruption. In other words, the storage system adopts a configuration capable of supplying power stored in the plurality of condensers to the memory at the time of instantaneous power supply interruption. Thereby, the storage system protects data saved in the memory even at a time that unexpected power interruption occurs. Further, the storage system programs data which responds to a received write command that writing is completed, to the memory as normally as possible.

In such a storage system, a plurality of condensers for PLP are connected in parallel. Therefore, if short mode failure occurs in even one of the plurality of condensers, there is a possibility that a PLP function does not work.

SUMMARY

The problem to be solved by the embodiment is to provide a storage system and a protection method which are capable of reducing a possibility that the PLP function of protecting the semiconductor storage element does not work, even when the short mode failure occurs in the condenser for PLP.

A storage system of an embodiment has a power supply circuit, a backup circuit and a switch circuit. The power supply circuit supplies power to a semiconductor storage element. The backup circuit has a condenser capable of being charged by using the power from the power supply circuit and supplies the power charged on the condenser to the semiconductor storage element when a voltage of the power supply circuit declines to be equal to or smaller than a threshold value set in advance. The switch circuit monitors a value of a leakage current of the condenser and performs an operation related to deterioration of the condenser when the value of the leakage current fulfills a deterioration condition set in advance.

DETAILED DESCRIPTION

Figure 1:
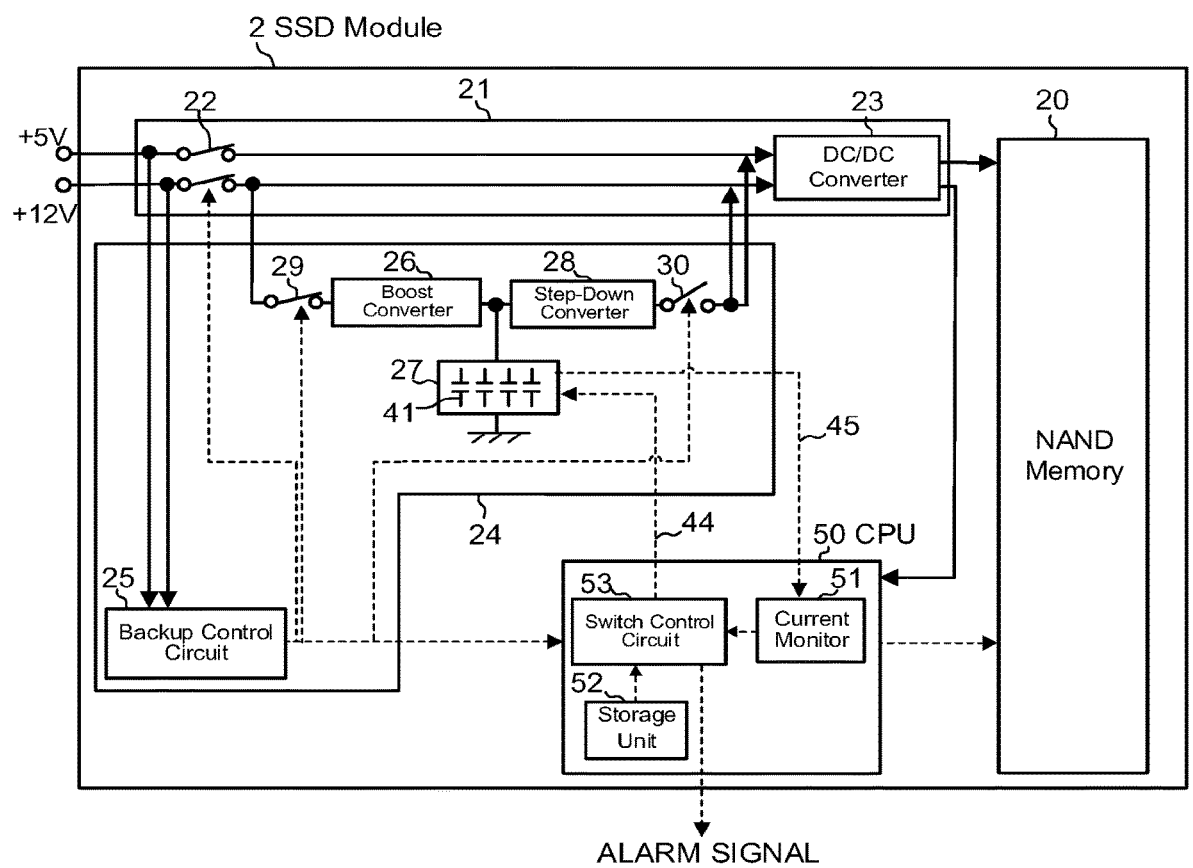
FIG. 1 is a block diagram illustrating a configuration of a storage system according to an embodiment.

Hereinafter, an embodiment will be described in detail with reference to the drawings. FIG. 1 is a block diagram illustrating a configuration of an SSD module being an example of a storage system according to the embodiment. In FIG. 1, a line (control line) indicating a flow of a control signal is expressed by a dotted line while a line (power supply line) sending power supply is expressed by a solid line.

The SSD module 2 according to one embodiment illustrated in FIG. 1 stores data of a not-illustrated buffer memory in a NAND flash memory 20 (hereinafter, referred to as a "NAND memory 20") and reads the data stored in the NAND memory 20 to the buffer memory.

The SSD module 2 has the NAND memory 20 as a semiconductor storage element, a power supply circuit 21, a PLP circuit 24 as a backup circuit, a CPU 50 and so on.

The NAND memory 20 has memory blocks divided with respect to each address. The CPU 50 can designate the memory block to store data in by using the address when the data is to be written to the NAND memory 20 (at a time of data writing). Further, the CPU 50 can designate the memory block to read data from by using the address when the data is to be read from the NAND memory 20 (at a time of data reading).

The power supply circuit 21 receives supply of power from the outside of the SSD module 2 and supplies the power to the NAND memory 20, the CPU 50 and the not-illustrated buffer memory in response to a control signal.

The PLP circuit 24 is a circuit assisting the power supply circuit 21 to a certain degree to prevent a halt (including instantaneous interruption) of the power supply to the NAND memory 20, the CPU 50, the not-illustrated buffer memory or the like. The PLP circuit 24 has a condenser (capacitor) and supplies power that the condenser has been charged with to the NAND memory 20, the CPU 50, the not-illustrated buffer memory or the like when power supply interruption occurs during transfer of the data stored in the buffer memory or the like to the NAND memory 20. Thereby, the PLP circuit 24 makes the NAND memory 20, the CPU 50, the not-illustrated buffer memory or the like continue data transfer.

The CPU 50 monitors a value of a leakage current of the condenser of the PLP circuit 24. When the leakage current fulfils a deterioration condition stored in advance (when the value exceeds an upper limit value of the leakage current), the CPU 50 performs an operation (such as separation of the circuit, an output operation of an alarm signal) related to deterioration of the condenser.

Subsequently, a configuration of the power supply circuit 21 will be described in detail. The power supply circuit 21 has a switch 22, a DC/DC converter 23 and a circuit wiring which connects therebetween. The switch 22 switches whether to supply the power such as +5V and +12V to be inputted to the SSD module 2 to an inside circuit or to block it off. The DC/DC converter 23 converts a voltage of the power such as +5V and +12V into a prescribed voltage (3.3V, 2.5V, 1.8V, 0.9V, 1.35V or the like) and supplies to the NAND memory 20, the CPU 50, the not-illustrated buffer memory or the like.

Subsequently, a configuration of the PLP circuit 24 will be described in detail. The PLP circuit 24 has a backup control circuit 25, a boost converter 26, a condenser circuit 27 having a condenser 41, a step-down converter 28, switches 29, 30 as a switching circuit, and so on.

The backup control circuit 25 detects a power supply voltage (prescribed value is +5V, +12V or the like) inputted to the power supply circuit 21. When the backup control circuit 25 detects a decline of voltage, that is, a voltage of lower than a threshold voltage (+3.5V, +10V or the like) set in advance, the backup control circuit 25 controls the switches 29, 30 to supply the power that the condenser 41 of the condenser circuit 27 is charged with to the NAND memory 20, the CPU 50, the not-illustrated buffer memory or the like.

The boost converter 26 is a device raising the voltage (+12V or the like) of the power supplied from the power supply circuit 21 via the switch 29 to a voltage (for example, about 25V to 30V) enabling a charge of the condenser 41 of the condenser circuit 27.

The condenser circuit 27 stores power in the condenser 41. The condenser circuit 27 supplies the power stored in the condenser 41 to the NAND memory 20, the CPU 50, the not-illustrated buffer memory or the like in response to the control signal from the backup control circuit 25.

The step-down converter 28 is a device reducing the voltage (for example, about 25V to 30V) of the power stored in the condenser 41 to a voltage (+5V, +12V or the like) for supplying the power to the DC/DC converter 23.

The switch 29 switches the circuit for charging the condenser 41 of the condenser circuit 27 with the power supplied from the power supply circuit 21. The switch 30 switches the circuit for supplying the power that the condenser 41 is charged with to the NAND memory 20, the CPU 50, the not-illustrated buffer memory or the like. The switches 29, 30 are controlled by the control signal (dotted line in FIG. 1) from the backup control circuit 25.

Figure 3:
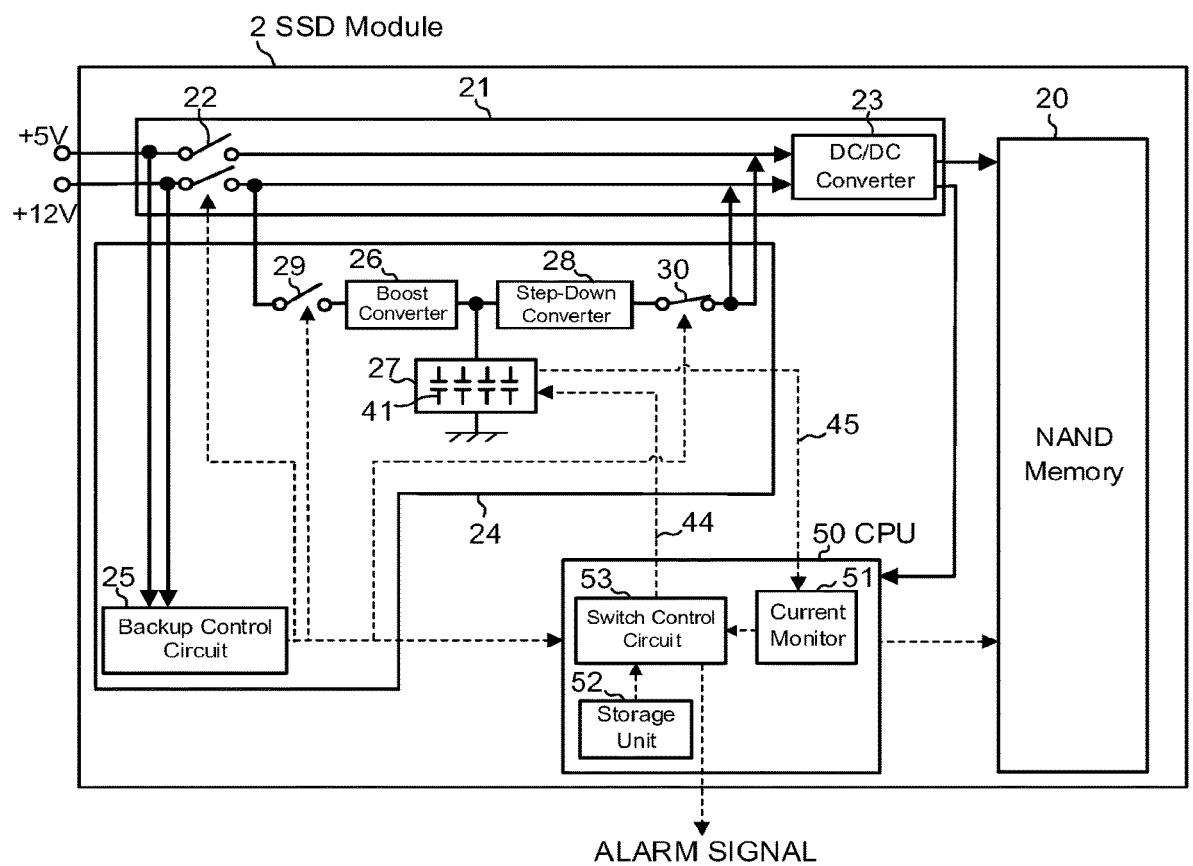
FIG. 3 is a block diagram illustrating a state of a switch at a time that the storage system according to the embodiment performs a backup operation.

Subsequently, an operation of the backup control circuit 25 will be described with reference to FIG. 1 and FIG. 3. The backup control circuit 25 closes the switch 22 and the switch 29 and opens the switch 30 as illustrated in FIG. 1 when charging the condenser 41 with the power supplied from the power supply circuit 21. In this case, the circuit for supplying the power from the power supply circuit 21 to the PLP circuit 24 is connected. On the other hand, the circuit for supplying power from the PLP circuit 24 to the DC/DC converter 23 of the power supply circuit 21 is disconnected. When supplying the power that the condenser 41 is charged with to the NAND memory 20, the CPU 50, the not-illustrated buffer memory or the like, the backup control circuit 25 opens the switch 22 and the switch 29 and closes the switch 30 as illustrated in FIG. 3. In this case, the circuit supplying the power from the power supply circuit 21 to the PLP circuit 24 is disconnected. On the other hand, the circuit for supplying the power from the condenser 41 of the PLP circuit 24 to the NAND memory or the like via the DC/DC converter 23 is connected.

Figure 2:
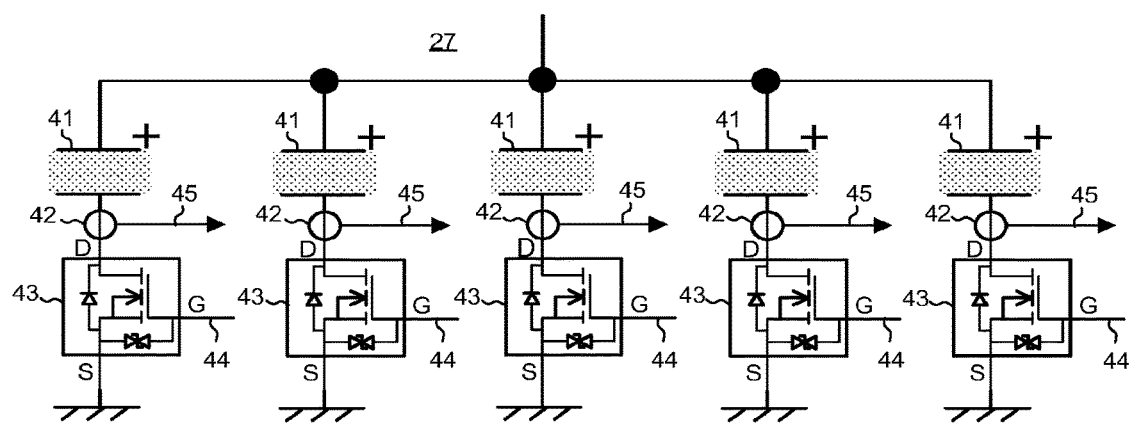
FIG. 2 is a circuit diagram illustrating a configuration of a condenser circuit 27 of the storage system according to the embodiment.

Here, a configuration of the condenser circuit 27 will be described in detail with reference to FIG. 2. FIG. 2 is a circuit diagram illustrating the configuration of the condenser circuit 27 of the storage system according to the embodiment of the present invention. The condenser circuit 27 has a plurality of condensers 41 as charge/discharge elements, a plurality of current detectors 42, and a plurality of MOS FETs 43 as switches. The condensers 41, the current directors 42 and he MOS FETs 43 are connected one by one in series. The plurality of condensers 41 are connected in parallel.

The condenser 41 is charged with the power supplied from the power supply circuit 21 in FIG. 1. The condenser 41 can supply the power that the condenser 41 is charged with to the NAND memory 20, the CPU 50, the not-illustrated buffer memory or the like in FIG. 3.

The current detector 42 is provided between a cathode of the condenser 41 and a drain D of the MOS FET 43. The current detector 42 detects a current flowing between the cathode of the condenser 41 and the drain D of the MOS FET 43. The current detector 42 has, as an example for instance, a resistor connected between the cathode of the condenser 41 and the drain D of the MOS FET 43 in series. The current flowing in the condenser 41 can be detected by a method such as measuring an inter-terminal voltage of the resistor (voltage drop), and so on. A signal line 45 is drawn from the current detector 42. The signal line 45 is connected to the CPU 50.

The MOS FET 43 has respective terminals of the drain D, a source S, and a gate G. The drain D is connected to a cathode side of the condenser 41 via the current detector 42. The source S is connected to a ground potential GND. The gate G is connected to a control line 44 connected to the CPU 50. To each gate G of the plurality of MOS FETs 43, the control line 44 independent of each other is connected.

The MOS FET 43 switches a continuity state between the drain D and the source S by a gate control signal inputted from the CPU 50 to the gate G via the control line 44. As a result of each input of the gate control signals from the CPU 50 via the control line 44 independent of each other, the plurality of MOS FETs 43 can switch each continuity state between the drain D and the source S individually. In other words, the plurality of MOS FETs 43 independently opens/closes connection between the cathode of the condenser 41 and the ground GND of the PLP circuit 24 by being controlled by the CPU 50.

Subsequently, a configuration of the CPU 50 will be described in detail with reference to FIG. 1. The CPU 50 has a current monitor 51 as a monitoring circuit, a storage unit 52, a switch control circuit 53, and so on.

The current monitor 51 monitors an output signal obtained from the current detector 42 of the condenser circuit 27 via the signal line 45 and detects a value of a leakage current of the condenser 41.

In the storage unit 52, there is stored a deterioration condition including a threshold value of a leakage current indicating deterioration of the condenser 41. The threshold value includes a first threshold value (for example, several mA) of the leakage current in a case of a light degree of deterioration of the condenser 41 and a second threshold value (for example, several hundreds mA) of the leakage current in a case of a heavy degree of deterioration of the condenser 41.

The switch control circuit 53 outputs an alarm signal to the outside when the value of the leakage current of the condenser 41 reaches the first threshold value, for example. When the leakage current reaches the second threshold value, the switch control circuit 53 sends a control signal to separate the condenser 41 from the ground potential GND of the PLP circuit 24, to the MOS FET 43 of the condenser circuit 27 via the control line 44. The MOS FET 43 switches the continuity state between the drain D and the source S based on the control signal sent from the control circuit 53.

The condenser 41 is separated from the condenser circuit 27 by the MOS FET 43 whose continuity state is controlled by the control signal.

When the value of the leakage current of the condenser 41 is equal to or smaller than the threshold value (permissive value), the CPU 50 controls the continuity state between the drain D and the source S of the MOS FET 43 to be maintained, making the cathode of the condenser 41 and the ground potential GND of the PLP circuit 24 be in a state of being connected. When the value of the leakage current of the condenser 41 increases as far as over the threshold value (permissive value), the CPU 50 opens the connection between the drain D and the source S of the MOS FET 43 to make the cathode of the condenser 41 and the ground potential GND of the PLP circuit 24 be in a state of being separated. Further, the CPU 50 outputs an alarm signal.

Note that when one deterioration condition is fulfilled, that is, when the leakage current reaches the threshold value, an alarm signal may be outputted, and the condenser 41 may be separated from the ground potential GND of the PLP circuit 24, and these operations may be performed simultaneously.

Hereinafter, an operation of the SSD module 2 according to the embodiment of the present invention will be described with reference to FIG. 1 to FIG. 5.

Figure 4:
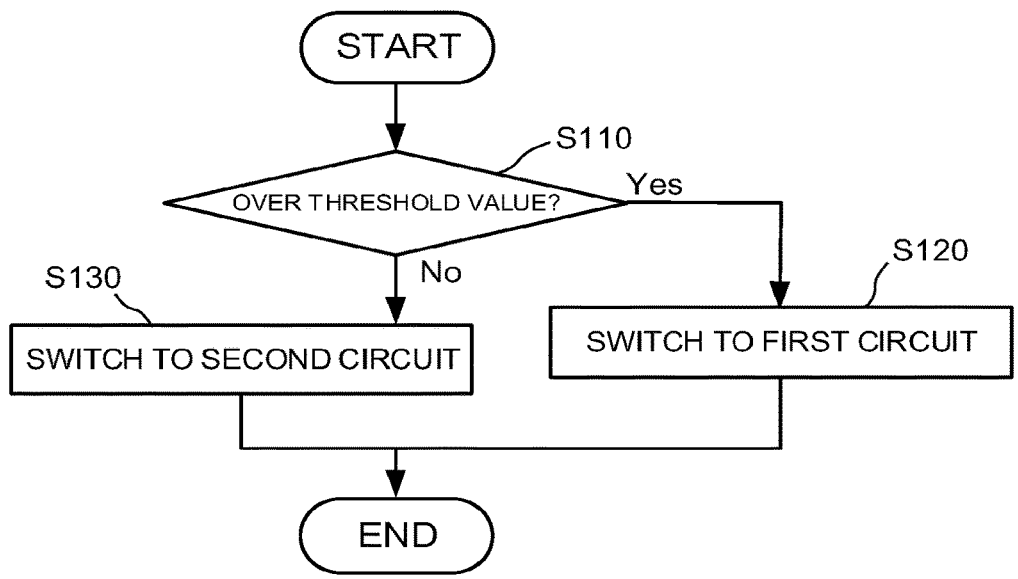
FIG. 4 is a flowchart illustrating an operation example of a backup control circuit 25 of the storage system according to the embodiment.

First, an operation example of the backup control circuit 25 of the SSD module 2 will be described. FIG. 4 is a flowchart illustrating the operation example of the backup control circuit 25 of the storage system according to the embodiment.

The backup control circuit 25 monitors a voltage of a current supplied to the power supply circuit 21. When detecting the voltage of the current supplied to the power supply circuit 21, the backup control circuit 25 judges whether or not the detected voltage value exceeds a predetermined threshold value (S110).

When the detected voltage value exceeds the predetermined threshold value (Yes in S110), the backup control circuit 25 closes the switch 22, closes the switch 29 and opens the switch 30 (S120), as illustrated in FIG. 1. Then, the backup control circuit 25 ends the backup operation (END). In FIG. 1, the plurality of condensers 41 of the condenser circuit 27 are charged with the power from the power supply circuit 21. Hereinafter, the circuit in a state where the plurality of condensers 41 are charged as in FIG. 1 is referred to as a first circuit.

When the detected voltage value is equal to or lower than the predetermined threshold value (No in S110), the backup control circuit 25 opens the switch 22, opens the switch 29 and closes the switch 30 (S130) as illustrated in FIG. 3. Then, the backup control circuit 25 ends the backup operation (END). In FIG. 3, the power that the condenser 41 of the condenser circuit 27 is charged with is supplied to the NAND memory 20, the CPU 50, the not-illustrated buffer memory or the like. Hereinafter, the circuit as in FIG. 3 is referred to a second circuit. The operation of S130 suppresses a halt of power supply to the NAND memory 20, the CPU 50, the not-illustrated buffer memory or the like at the time of data reading/writing, enabling a data reading/writing operation to continue as much as possible.

Figure 5:
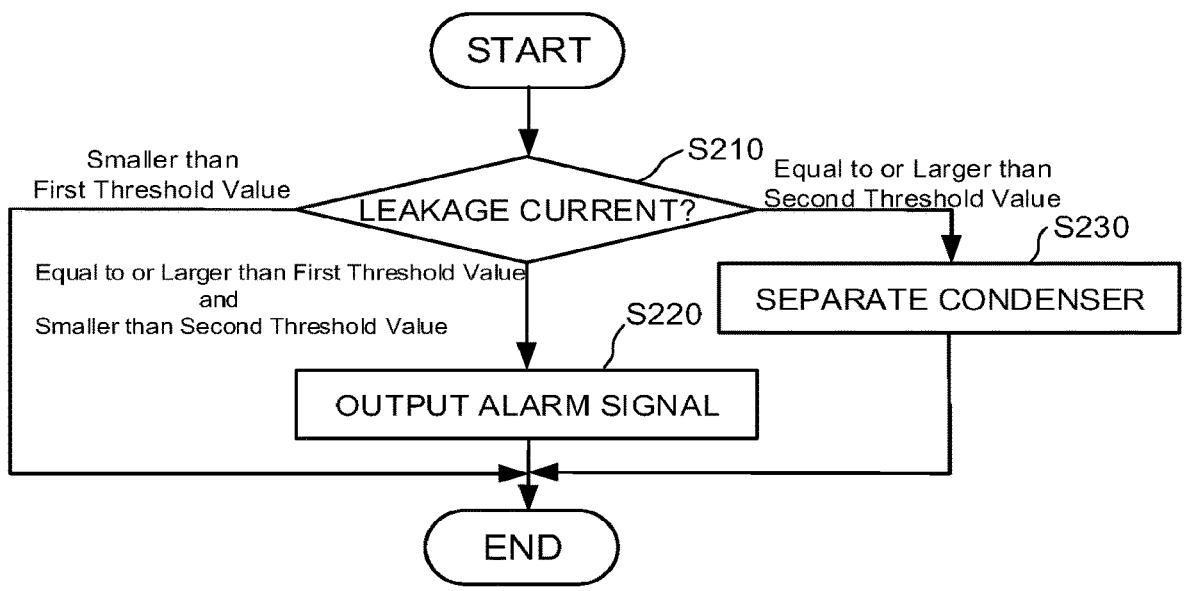
FIG. 5 is a flowchart illustrating an operation example of a switch control circuit 53 of the storage system according to the embodiment.

Subsequently, an example of an operation of the switch control circuit 53 of the SSD module 2 will be described. FIG. 5 is a flowchart illustrating the operation example of the switch control circuit 53 of the storage system according to the embodiment.

In the SSD module 2 according to the embodiment, the current monitor 51 of the CPU 50 detects a value of the leakage current flowing in each of the plurality of condensers 41 of the condenser circuit 27. The current monitor 51 notifies the switch control circuit 53 of the detected leakage current value. In other words, the switch control circuit 53 monitors the leakage current of the condenser 41 via the current monitor 51.

The switch control circuit 53 judges whether or not the leakage current value of the condenser 41 fulfils the deterioration condition stored in the storage unit 52 in advance (S210). During monitoring, when the leakage current value of a certain condenser 41 fulfils the deterioration condition stored in the storage unit 52 in advance, the switch control circuit 53 performs an operation related to deterioration of that condenser 41 (separation of the circuit or an output operation of an alarm signal). For example, as the deterioration condition of the condenser 41, the storage unit 52 can store in advance two threshold values of the first threshold value (several mA) in the case of the light degree of deterioration of the condenser 41 and the second threshold value (several hundreds mA) in the case of the heavy degree of deterioration of the condenser 41.

When the leakage current of the condenser 41 is smaller than the first threshold value (smaller than the first threshold value in S210), the switch control circuit 53 ends the processing (END).

When the leakage current of the condenser 41 is equal to or larger than the first threshold value and smaller than the second threshold value, that is, exceeds an acceptable value indicating that the condenser 41 reaches a light deterioration state (equal to or larger than the first threshold value and smaller than the second threshold value in S210), the switch control circuit 53 outputs an alarm signal (S220). Then, the switch control circuit 53 ends the processing (END).

When the leakage current of the condenser 41 reaches the second threshold value (several hundreds mA), that is, exceeds an allowable value indicating that the condenser 41 reaches a heavy deterioration state (equal to or larger than the second threshold value in S210), the switch control circuit 53 outputs a gate control signal to the MOS FET 43 connected to the condenser 41 whose leakage current has exceeded the second threshold value in the condenser circuit 27 via the control line 44. Consequently, continuity between the drain D and the source S in that MOS FET 43 is made off, so that the condenser 41 is separated from the ground GND of the PLP circuit 24 (S230). Then, the switch control circuit 53 ends the processing (END).

When the leakage current of the condenser 41 tends to increase, the SSD module 2 of the embodiment can separate the condenser 41 whose leakage current has tended to increase before short mode failure occurs in the plurality of condensers 41, by the above operations of steps 210 to 230. According to the SSD module 2 of the embodiment, it is possible to avoid a trouble that the PLP function to the NAND memory 20 does not work due to the short mode failure of the condenser 41 for PLP.

In the above-described embodiment, the MOS FET 43 is connected to the cathode side of the condenser 41, because this enables a gate control signal (a gate voltage) to be low. The MOS FET 43 may be connected to an anode side of the condenser 41. Further, the position of the leakage current monitor may be other than the above-described position.

Further, in the above-described embodiment, before short mode failure occurs in the plurality of condensers 41, the CPU 50 separates the condenser 41 whose leak current has tended to increase from the ground potential GND of the PLP circuit 24. When the feature (for example, an electrostatic capacitance or the leakage current) of the condenser 41 recovers in a state where the condenser 41 is separated, the CPU 50 may make the drain D and the source S of the MOS FET 43 continued, to thereby connect the condenser 41 to the ground potential GND of the PLP circuit 24.

By separating the condenser 41 whose leakage current has tended to increase before short mode failure occurs in the plurality of condensers 41, it is possible to prolong a life of the entire PLP circuit 24 by the remaining condensers 41.

There are various failure modes (a degree of deterioration or a deterioration state) of the condenser 41 other than the short mode, that is, for example, evaporation of an electrolytic solution. Thus, it is possible to set deterioration conditions of different failure modes (a threshold value or an allowable value of used time or temperature, other than the threshold value of leakage current), and when the deterioration condition is fulfilled, an alarm may be outputted or the condenser 41 fulfilling the deterioration condition may be separated. Since there are case of having a plenty of time and case of requiring an urgent processing, different alarms may be outputted in stages in response to the deterioration condition of the condenser 41.

Embodiments have been described, but the above-described embodiments have been presented by way of example only, and are not intended to limit the scope of the inventions. The above-described new embodiments may be embodied in a variety of other forms, and various omissions, substitutions and changes in the form may be made without departing from the spirit of the invention. The above-described embodiments and their modifications are included in the scope and spirit of the invention and are included in the invention described in claims and their equivalents.

What is claimed is:

1. A storage system comprising:
a power supply circuit supplying power to a semiconductor storage element;
a backup circuit having a condenser capable of being charged by using the power from the power supply circuit and supplying the power charged on the condenser to the semiconductor storage element when a voltage of the power supply circuit declines to be equal to or smaller than a threshold value set in advance; and
a switch circuit monitoring a value of a leakage current of the condenser and performing an operation related to deterioration of the condenser when the value of the leakage current fulfills a deterioration condition set in advance,
wherein the backup circuit further comprises a switch capable of separating the condenser from the backup circuit by a control signal,
wherein the deterioration condition includes a first threshold value of a leakage current in a case of a light degree of deterioration of the condenser and a second threshold value of a leakage current in a case of a heavy degree of deterioration of the condenser, and
wherein the switch circuit outputs an alarm signal when the leakage current of the condenser reaches the first threshold value, and sends the control signal to the switch when the leakage current of the condenser reaches the second threshold value.

2. The storage system according to claim 1, wherein the switch circuit outputs an alarm signal when the value of the leakage current fulfils the deterioration condition set in advance.

3. The storage system according to claim 1, wherein the backup circuit comprises:
a switching circuit to perform charging/discharging of the condenser by using the power of the power supply circuit; and
a backup control circuit detecting a voltage inputted to the power supply circuit, and controlling the switching circuit to supply the power charged on the condenser to the semiconductor storage element when the voltage equal to or lower than the threshold value set in advance is detected.

4. A storage system comprising:
a power supply circuit supplying power to a semiconductor storage element;
a backup circuit having a condenser capable of being charged by using the power from the power supply circuit and supplying the power charged on the condenser to the semiconductor storage element when a voltage of the power supply circuit declines to be equal to or smaller than a threshold value set in advance; and
a switch circuit monitoring a value of a leakage current of the condenser and performing an operation related to deterioration of the condenser when the value of the leakage current fulfills a deterioration condition set in advance,
wherein the backup circuit further comprises a switch capable of separating the condenser from the backup circuit by a control signal, and
wherein the switch circuit sends the control signal to the switch when the value of the leakage current fulfils the deterioration condition set in advance,
wherein the switch circuit comprises:
a monitoring circuit detecting the value of the leakage current of the condenser;
a storage circuit memorizing the deterioration condition including the threshold value of the leakage current indicating deterioration of the condenser; and
a switch control circuit which outputs an alarm signal and sends the control signal to the switch or performs outputting of the alarm signal or sending of the control signal to the switch, when the value of the leakage current detected by the monitoring circuit exceeds the threshold value.

5. The storage system according to claim 4, wherein the switch control circuit halts sending of the control signal to the switch and connects the condenser to the backup circuit when a condenser feature including one or more of an electrostatic capacitance and the leakage current of the separated condenser recovers.

6. A protection method comprising:
supplying power from a power supply circuit to a semiconductor storage element;
charging a condenser having a grounded potential at one end by using the power from the power supply circuit;
monitoring a voltage of the power supply circuit, and supplying the power charged on the condenser to the semiconductor storage element when the voltage equal to or lower than the threshold value set in advance is detected; and
monitoring a value of a leakage current of the condenser, and performing an operation related to deterioration of the condenser when the monitored value of the leakage current of the condenser fulfils a deterioration condition set in advance, the deterioration condition including a first threshold value of a leakage current in a case of a light degree of deterioration of the condenser and a second threshold value of a leakage current in a case of a heavy degree of deterioration of the condenser, and outputting an alarm signal when the leakage current of the condenser reaches the first threshold value, and separating the condenser from the grounded potential when the leakage current of the condenser reaches the second threshold value.

\* \* \* \* \*